United States Patent [19]
Gruodis et al.

[11] Patent Number: 6,092,225
[45] Date of Patent: Jul. 18, 2000

[54] ALGORITHMIC PATTERN GENERATOR FOR INTEGRATED CIRCUIT TESTER

[75] Inventors: Algirdas Joseph Gruodis, Wappinger Falls, N.Y.; Philip Theodore Kuglin, Tualatin; Badih John Rask, Portland, both of Oreg.

[73] Assignee: Credence Systems Corporation, Fremont, Calif.

[21] Appl. No.: 09/240,183

[22] Filed: Jan. 29, 1999

[51] Int. Cl.[7] .............................. G01R 31/28; G06F 11/00
[52] U.S. Cl. .......................... 714/724; 714/738; 324/73.1
[58] Field of Search .................................. 714/724, 738, 714/728, 739; 324/73.1

[56] References Cited

U.S. PATENT DOCUMENTS

| | | | |
|---|---|---|---|
| 4,460,999 | 7/1984 | Schmidt .................................. | 714/711 |
| 5,012,471 | 4/1991 | Powell et al. ............................ | 714/744 |
| 5,142,223 | 8/1992 | Higashino et al. ...................... | 714/724 |
| 5,479,414 | 12/1995 | Keller et al. ............................ | 714/726 |
| 5,862,149 | 1/1999 | Carpenter et al. ...................... | 714/738 |

*Primary Examiner*—Emmanuel L. Moise
*Attorney, Agent, or Firm*—Daniel J. Bedell; Smith-Hill and Bedell

[57] ABSTRACT

An integrated circuit (IC) tester organizes an IC test into a succession of test cycles, each test cycle being subdivided into four segments. The tester includes a separate tester channel for carrying out a test activity at each IC pin during each segment of the test cycle. The tester also includes a separate pattern generator for each channel. Each pattern generator concurrently generates four vectors at the start of each test cycle. Each vector tells the channel what activity it is to carry out during a separate segment of the test cycle. Each pattern generator includes a low-speed vector memory storing large blocks of vectors at each address and a cache memory system for caching blocks of vectors read out of the vector memory at a low frequency and then reading vectors out in sets of 16 at the higher test cycle frequency. A vector alignment circuit selects from among the cache memory output vectors to provide the four vectors to the channel for the test cycle. Thus the frequency of test activities carried out by the tester is four times greater than the cache memory read access frequency and many times the vector memory read access frequency. To conserve vector memory space when repetitive vector sequences are to be generated, the cache memory system repeatedly read accesses various vector sequences both in the vector memory and in the cache memory.

20 Claims, 4 Drawing Sheets

ALGORITHMIC PATTERN GENERATOR FOR INTEGRATED CIRCUIT TESTER

BACKGROUND OF THE INVENTION

1. Field of the Invention

The present invention relates in general to integrated circuit testers and in particular to a high-speed algorithmic pattern generator for an integrated circuit tester.

1. Description of Related Art

A typical integrated circuit (IC) tester includes a separate channel connected to each pin of an IC under test. The tester organizes an IC test into a succession of test cycles. During each test cycle each channel may transmit a test signal to an IC pin or may sample an IC output signal produced at the pin to determine whether it is of an expected state. Before the start of each test cycle each channel receives a data value (a "vector") telling it when and how to change the state of its input test signal during the cycle or when to sample the IC output signal during the cycle and indicating the expected IC output signal state.

Each channel of a "per pin" IC tester includes its own pattern generator for providing a vector at the start of each test cycle. A simple pattern generator includes a random access memory (RAM) storing vectors needed for successive test cycles at successive addresses and a counter for incrementing the vector memory address before the start of each test cycle so that the vector memory reads out the vectors in succession. As ICs have become more complex, the number of test cycles (and vectors) needed to test an IC continues to increase. In many cases it has become impractical to provide a vector memory large enough to store a vector for each test cycle. However since many tests involve repetitive operations, channels often require repetitive sequences of vectors. More sophisticated pattern generators replace the counter with an instruction processor and an instruction memory storing an algorithmic program. The program tells the instruction processor how to address the vector memory during a test. Loop and subroutine call instructions tell the instruction processor to repeatedly access various vector sequences stored in the memory when repetitive test activities are to be carried out.

As the IC's operating frequencies continue to increase, the test cycle length must decrease in order to provide high frequency input signals to the IC and in order to sample IC output signals at high frequencies. When a vector memory must read out a vector at the start of each test cycle, the vector memory must also operate at higher frequencies. However large, high frequency RAMs are expensive and in some cases available RAMs simply aren't as fast as some of the ICs being tested. One solution to this problem has been to store more than one vector at each vector memory address so that the vector memory does not have to read out a vector at the start of every test cycle. For example if 128 vectors are stored at each vector memory address, then it is necessary to access the vector memory only once every 128 test cycles. In such case the vectors read out of the vector memory are written into a relatively small high-speed cache memory and then read back out of cache memory one vector at a time as they are needed.

While cache memories resolve the slow vector memory problem, they restrict the ability of algorithmic pattern generators to perform loops and calls. Since a vector must be written into cache memory sometime before it is needed, the caching system would have to somehow anticipate when a subroutine call or return or a loop return to start is going to occur. Since a vector must be supplied for every test cycle, and since it takes longer than one test cycle to access the vector memory, a call or return instruction that causes a jump in vector sequencing cannot direct the cache memory to obtain the first vector of a loop or call sequence directly from the vector memory. Some pattern generators can perform loops or calls by jumping to the start of a vector sequence already stored in cache memory, but the number of vectors included in the loop or subroutine is limited by the size of the cache memory.

When even cache memory is not fast enough to supply vectors at the test cycle frequency, "doublet mode" of tester operation has been employed. In the doublet mode, a test cycle is divided into two segments and the vector produced by the pattern generator at the start of a test cycle indicates channel operations that are to be carried out in each of the two segments. Thus the test frequency, the frequency at which test activities are carried out at the IC pins, is twice the vector output frequency of the cache memory. However doublet mode operation greatly complicates programming of algorithmic pattern generators because, since vectors are generated only on test cycle boundaries, loops and subroutines must start and end only on boundaries between test cycles and not on the boundary between the two segments of a test cycle. Thus when we program a doublet mode tester we have to keep track of the segment in which each test activity occurs and avoid attempting to start or end a loop or subroutine call or return with an activity occurring during the second segment of a test cycle. This makes tester programming very difficult, particularly when repetitive test sequences involve an odd number of test activities.

What is needed is an integrated circuit tester employing an algorithmic vector pattern generator using cache memory, which operates at a test frequency that is a multiple of the output frequency of the cache memory, but which places no restrictions on timing or length of loops and calls.

SUMMARY OF THE INVENTION

An integrated circuit (IC) tester in accordance with one aspect of the present invention organizes an IC test into a succession of test cycles, each test cycle being subdivided into four segments. The tester includes a separate tester channel for carrying out a test activity at each pin of the IC during each segment of the test cycle. The tester also includes a separate pattern generator for each channel for generating a set of four vectors at the start of each test cycle. Each of the four vectors is a data value telling the channel the activity it is to carry out during a separate one of the four test cycle segments.

In accordance with another aspect of the invention, the pattern generator includes a relatively low speed vector memory storing a large block of vectors (suitably 128 vectors) at each address. The pattern generator also includes a cache memory system for caching blocks of vectors read out of the vector memory at a low frequency and then reading vectors out of cache memory in sets of sixteen at the higher test cycle frequency. The pattern generator also includes a vector alignment circuit for selecting the four vectors for each test cycle from among the sequence of vector sets read out of cache memory. Thus test frequency is four times the cache memory read access rate and many times the vector memory access rate.

In accordance with a further aspect of the invention, the cache memory system implements loops and subroutine calls by repeatedly accessing various vector sequences both in the vector memory and in the cache memory. The cache memory system anticipates a return to a start of a loop, a subroutine call or a return from a subroutine by ensuring vectors forming the start of a loop, call or return are written into cache memory before they are needed and are retained in cache memory until no longer needed. While it reads the vectors at the start of a loop or subroutine out of cache memory, the cache memory system reads remaining portions of the loop or subroutine out of vector memory and loads them into cache memory so that they will be available when needed. Thus loops and subroutines need not be wholly contained in cache memory. Since the pattern generator produces four vectors instead of one for each test cycle, loop and call starts and returns may occur on any test cycle segment and are not restricted to test cycle boundaries.

It is accordingly an object of the invention to provide an integrated circuit tester employing an algorithmic vector pattern generator using cache memory, which operates at a test frequency that is a multiple of the output frequency of the cache memory, but which places no restrictions on length of loops and calls or on timing of loop starts, calls or returns relative to segment boundaries.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
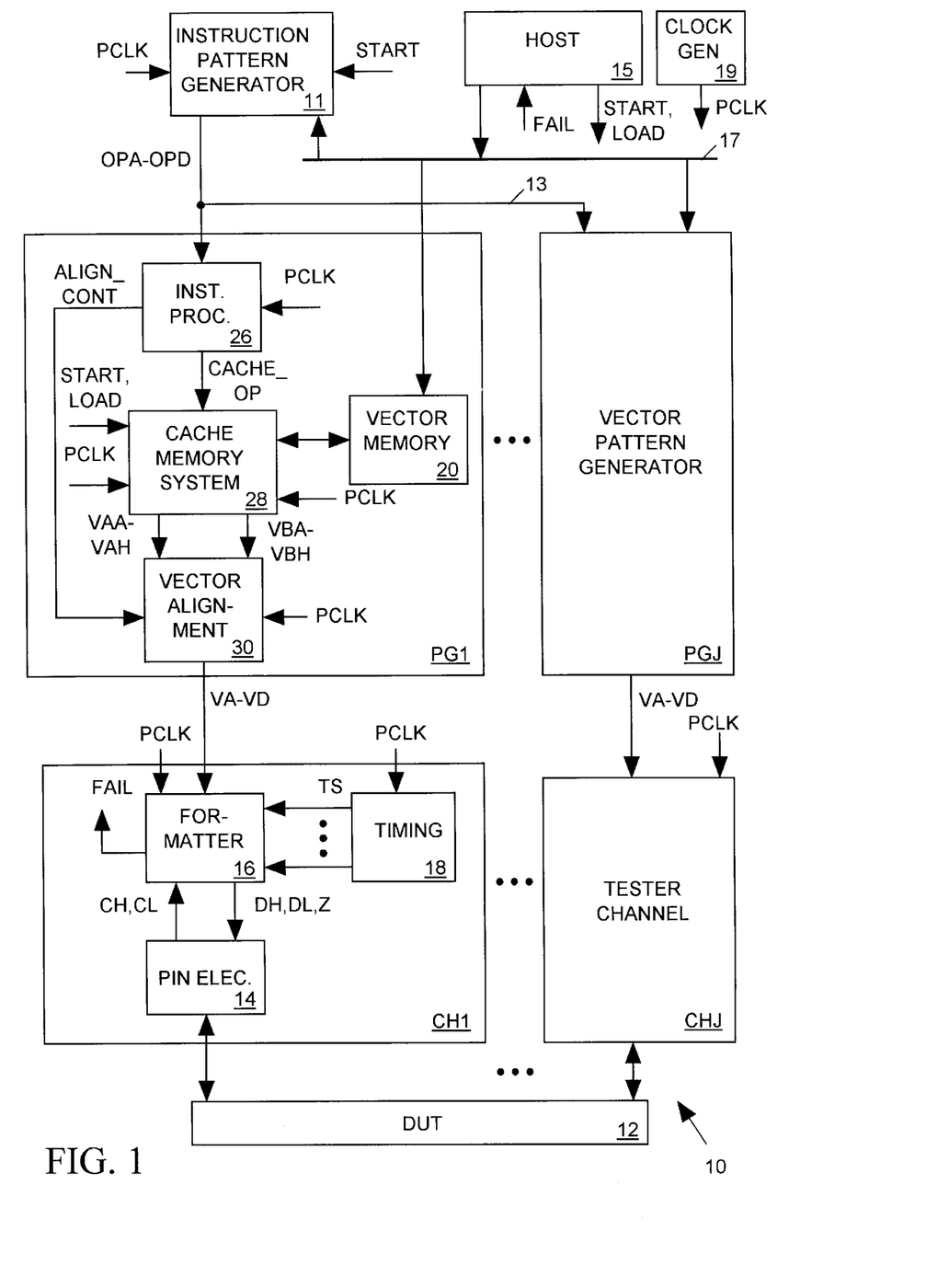
FIG. 1 illustrates an integrated circuit tester in accordance with the present invention.

FIG. 1 illustrates an integrated circuit tester 10 in accordance with the present invention. Tester 10 includes a set of J tester channels CH1 through CHJ, each connected to a separate pin of an integrated circuit device under test (DUT) 12. A test is organized into a succession of test cycles with each test cycle being subdivided into four segments. During each test cycle segment each channel CH1-CHJ carries out a test activity at its corresponding DUT 12 pin. A set of four vectors (data values) VA–VD supplied to each channel CH1–CHJ at the start of each test cycle indicates the test activities the channel is to carry out during the four segments of the test cycle. Test activities may include supplying a test signal input to the DUT pin or sampling a DUT output signal at the pin to determine whether it is of an expected state.

Tester 10 also includes a set of vector pattern generators PG1–PGJ, each for supplying an appropriate set of four vectors VA–VD to a corresponding channel CH1-CHJ at the start of each test cycle. A central instruction pattern generator 11 supplies a set of four instruction opcodes OPA–OPD to pattern generators PG1-PGJ via a parallel bus 13 for each test cycle. These opcodes tell each vector pattern generator PG1-PGJ which set of four vectors to supply to channels CH1-CHJ at the start of the test cycle. A host computer 15 programs instruction pattern generator 11 and vector pattern generators PG1-PGJ via computer bus 17. A central clock generator 19 supplies a period clock signal PCLK to pattern generators 11 and PG1-PGJ and to channels CH1-CHJ to mark the start of each test cycle.

Each vector pattern generator PG1-PGJ includes a vector memory 20 for storing of vectors supplied by host computer 15 via bus 17 before the start of the test. Each vector is a data value referencing a test activity a channel may carry out during one test cycle segment. A test activity may include changing the state of a DUT input signal or sampling a DUT output signal. Each vector also references a time during the segment that the activity is to be initiated. If a DUT output signal is to be sampled, the vector also indicates an expected state of the DUT output signal.

Vector memory 20 stores 128 vectors at each of its addressable storage locations. Each vector has a unique address. The higher order bits of a vector's address indicate the actual vector memory address at which a vector is stored. The lower order bits of a vector's address indicate the vector's position within the set of 128 vectors stored at the same memory address. The four opcodes OPA–OPD instruction pattern generator 11 supplies to each vector pattern generator PG1-PGJ for each test cycle indicate the vectors that are to be supplied to the corresponding tester channel CH1-CHJ at the start of the test cycle. The possible opcodes are listed below.

An "INC" opcode tells a vector pattern generator PG1-PGJ to obtain a vector for a segment by incrementing the address of the vector it supplied for the preceding test cycle segment.

A "REPEAT" opcode tells the vector pattern generator to obtain a vector for a segment by supplying the same vector it supplied for the preceding segment.

A "CALL" opcode tells the vector pattern generator to supply a vector for a segment by jumping to the first vector address of a "subroutine" sequence of vectors.

A "RETURN" opcode tells the vector pattern generator to supply a vector for a segment by returning to the vector address following the vector address preceding the call.

A "LOOP1_START" opcode is similar to an INC opcode but it tells the vector pattern generator to also save the next vector address as a "loop 1 start address" so that it may later return to that address.

A "LOOP1_BACK" opcode tells the vector pattern generator to obtain the vector for a segment by jumping to the last saved loop 1 start address. Thus the LOOP1_START opcode marks the start of a loop (LOOP 1) that may be repeated and the LOOP1_BACK opcode marks the end of the loop and indicates that the loop is to be repeated.

A "LOOP1_END" opcode is similar to an INC opcode but also tells the vector pattern generator that loop 1 is no longer to be repeated. "LOOP2_START", "LOOP2_BACK" and "LOOP2_END" opcodes are similar to the LOOP1_START, LOOP1_BACK and LOOP1_END opcodes but relate to a second loop, loop 2, that may be repeated.

Thus in addition to simply incrementing a vector address to obtain a vector for a test cycle segment, each vector pattern generator PG1-PGJ can perform vector address repeats and jumps and can access one vector sequence as a call and return and two vector sequence loops (loops 1 and 2) that may be nested.

Since vector memory 20 is a relatively slow dynamic random access memory (DRAM), it cannot read out a vector at the start of each segment. Accordingly vector memory 20 is made wide enough to store 128 vectors at each address so that although it may only read out vectors once every few test cycles, it reads out more than enough vectors whenever it is read accessed to control test activities for a large number of test cycles.

During the test a cache memory system 28 reads successive blocks of 128 vectors out of vector memory 20 and stores them in internal high-speed cache memories. Since each cache memory address holds 16 vectors, a block of 128 vectors read out of vector memory 20 is written into eight successive cache memory addresses. An instruction processor 26 receives and decodes each set of four opcodes OPA–OPD produced by instruction pattern generator 11 to supply an opcode CACHE_OP to cache memory system 28. The CACHE_OP opcode contains a memory pointer selecting one address in the cache memory containing 16 vectors previously read out of vector memory 20. Cache memory system 28 responds to the CACHE_OP opcode by supplying those 16 vectors as input vectors VAA–VAH, VBA–VBH to a "vector alignment" circuit 30.

Instruction processor 26 also generates alignment control signals ALIGN_CONT for controlling vector alignment circuit 30. Vector alignment circuit 30 responds to the ALIGN_CONT data by selecting four vectors from the multiple vectors read out of cache memory system 28 and providing them as output at the start of the next test cycle for controlling test activities of the channel during the test cycle.

In order to ensure that the proper four vectors VA–VD are delivered to each channel CH1-CHJ at the start of each test cycle, cache memory system 28 must read the appropriate block or blocks of vectors containing the four vectors VA–VD out of vector memory 20 and store those vector blocks in its internal cache memories some time before the test cycle in which the four vectors VA–VD are needed. Therefore before the start of the test, the cache memory system 28 of each vector pattern generator CH1-CHJ responds to a LOAD signal from host computer 15 by reading blocks of vectors stored at the first several vector memory 20 addresses and writing them into its internal cache memory. Cache memory system 28 stores each block of 128 vectors read out of vector memory 20 in sets of 16 vectors at sequential addresses of its internal cache memory. A few cycles before channels CH1-CHJ are to receive the first set of four vectors VA–VD, host computer 15 sends a START signal to instruction pattern generator 11 and vector pattern generators PG1-PGJ. Instruction pattern generator 11 then begins supplying a set of opcodes OPA–OPD to the instruction processor 26 of each vector pattern generator PG1-PGJ on each pulse of the PCLK signal.

Instruction processor 26 decodes each set of four opcodes OPA–OPD produced by pattern generator 11 by generating a CACHE_OP opcode input to cache memory system 28 and supplying the ALIGN_CONT signals input to vector alignment circuit 30. The CACHE_OP opcode tells cache memory system 28 to forward out a block of 16 vectors stored at one address of its internal cache memory to vector alignment circuit 30. The ALIGN_CONT signals tell vector alignment circuit 30 to select four of those vectors as the VA–VD vector input supplied to tester channel CH1 prior to the start of a test cycle. The process is repeated for each test cycle.

Cache memory systems 28 includes several internal cache memories but normally uses only two of them in an alternating fashion, writing vectors into one cache memory while reading vectors out of another. However as discussed in detail below, a LOOP1_START or LOOP2_START opcode may tell instruction processor 26 that the currently accessed cache memory contains vectors at the start of a loop to be repeated. Therefore instruction processor 26 tells cache memory system 28 to save the loop 1 or loop 2 start address and to retain the vectors in that particular cache memory for as long as the loop is be repeated. Cache memory system 28 then refrains from reloading that cache memory with new vectors from vector memory 20 after it reaches the last address of the cache memory and moves on to a next cache memory. When instruction processor 26 subsequently receives a LOOPL_BACK or LOOP2_BACK opcode, it tells cache memory system to immediately jump to cache memory address containing the first vector of the loop without having to take the time to reload the vectors at the start of the loop back into cache memory. When instruction processor 26 subsequently receives a LOOP1_END or LOOP2_END opcode, it tells cache memory system 28 that it no longer needs the vectors at the start of the loop. This allows cache memory system 28 to therefore reload that particular cache memory with new vectors from vector memory 20.

A sequence of vectors forming a "subroutine sequence" that may be repeatedly called is stored in a predetermined area of the vector memory 20 address space. When cache memory system 28 receives the LOAD signal from host 15 prior to the start of the test it loads the first several vectors of the subroutine sequence into a special "subroutine" cache memory and retains those vectors therein for the duration of the test. When instruction processor 26 receives a "CALL" opcode, cache memory system 28 jumps to the first address of the subroutine cache memory. While it thereafter reads the first portion of the subroutine sequence of vectors out of the subroutine cache memory, cache memory system 26 reads remaining vectors of the subroutine vector sequence out of vector memory 20 and loads them into other internal cache memories so that they will be available when the cache memory system 26 reaches the end of the subroutine cache memory.

When it receives a CACHE_OP opcode telling it to jump to the subroutine cache memory space, cache memory system 28 also stores the current cache memory read address as the address to which it returns in response to a subsequent RETURN opcode. It also refrains from loading new vectors into the current cache memory until after the return so that the vectors it needs after the return are available in cache memory when needed.

Cache Memory System

Figures 2, 3:
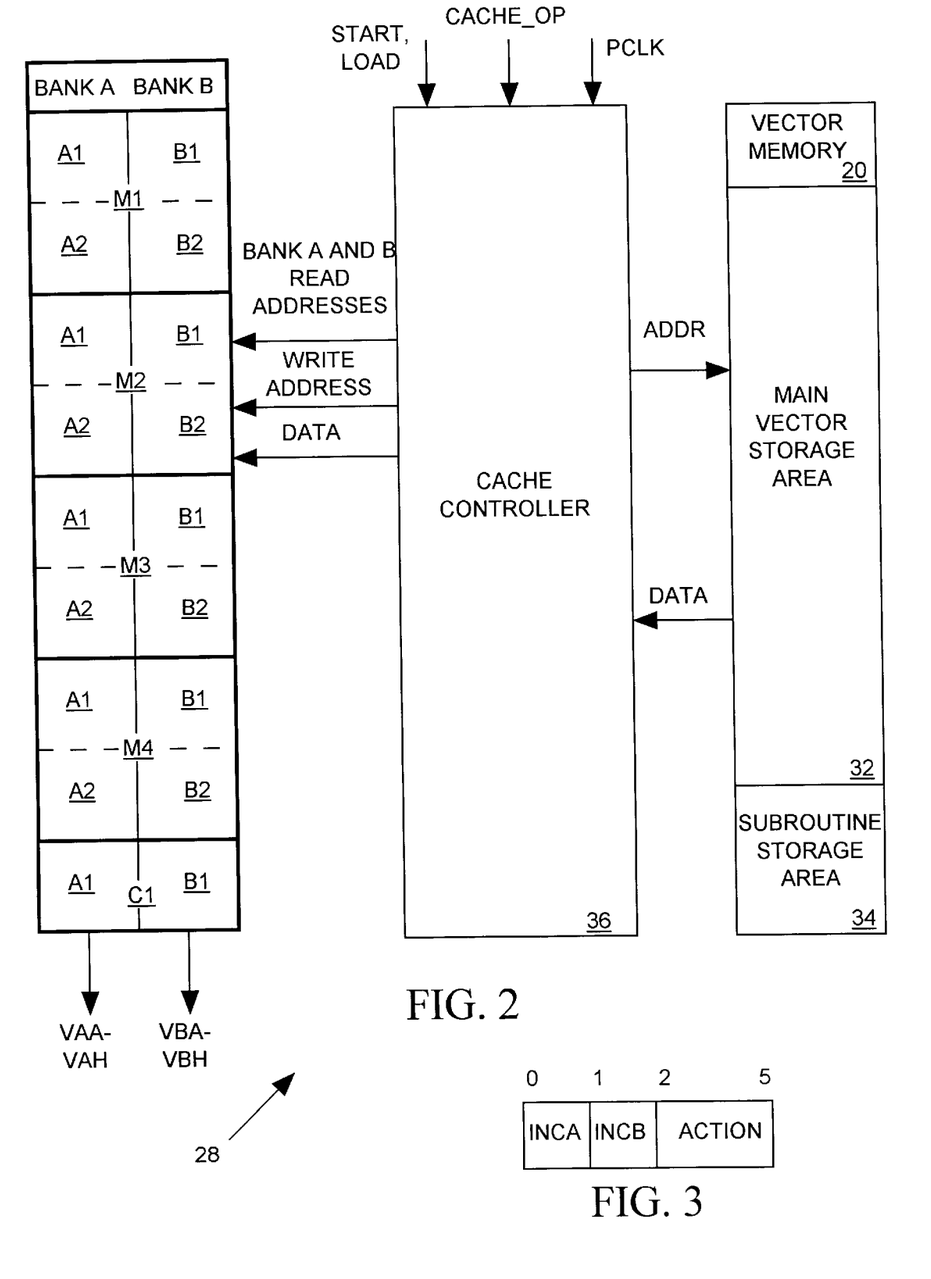
FIG. 2 illustrates the cache memory system and vector memory of FIG. 1 in more detailed block diagram form.
FIG. 3 illustrates the bit pattern of a CACHE_OP opcode the instruction processor of FIG. 1 supplies to the cache controller at the start of each test cycle.

FIG. 2 illustrates cache memory system 28 and vector memory 20 of FIG. 1 in more detailed block diagram form. Cache memory system 28 includes a cache controller 36, a set of four main cache memories M1-M4 and one subroutine cache memory C1. Each cache memory occupies a separate portion of a common cache memory address space and each includes a pair of independently addressed cache memory banks A and B. The memory bank A and B of each main cache memory M1-M4 is further subdivided into two independently addressable blocks A1 and A2 or B1 and B2. The A and B banks of subroutine cache C1 include only one block A1 or B1. Each cache memory block A1 or B1 has 256 addressable storage locations, each capable of storing eight vectors. When loading a block of vectors into cache memory, cache controller 36 writes the vectors in alternating fashion into successive addresses of blocks A and B of one of the cache memories. When reading vectors out of a cache memory, cache controller 36 supplies separate read addresses to bank A and bank B causing banks A and B to read out two 8-vector sets VAA–VAH and VBA–VBH, respectively, to vector alignment circuit 30 of FIG. 1. Since banks A and B are independently addressable, cache controller 36 may increment either the A or B bank address in order to advance the vector address sequence.

Vector memory 20 stores 128 vectors at each address of a "main vector storage" area 32 of its address space and stores 128 vectors at each address of a "subroutine storage" area 34 of its address space. In response to the LOAD signal, cache controller 36 reads successive vectors out of the subroutine area 34 of vector memory 20 and writes them into cache C1. The first 8 vectors of the subroutine are written into the first address of block A1 of cache C1 and the second 8 vectors are written to the first address of block B1. The remaining addresses of blocks A1 and B1 of cache C1 are filled with successive subroutine vectors read out of storage area 34 in a similar alternating manner. Thus the first 16×256 vectors of the subroutine are initially written into cache C1. These vectors remain in cache C1 throughout the test.

Also in response to the LOAD signal, cache controller 36 reads the first 16×256 vectors out of the first 32 addresses of the main routine area 32 of vector memory 20 and writes them in alternating fashion into successive addresses of A1 and B1 of cache memory M1.

On a PCLK clock pulse following the START signal, after instruction processor 26 has had a few cycles to generate the CACHE_OP opcode for the first test cycle, cache controller 36 responds to the CACHE_OP opcode by read addressing the first address of blocks A1 and B1 of M1 so that they read out the set of 16 vectors VAA–VAH, VBA–VBH for the first test cycle. At the same time, cache controller 36 begins filling blocks A2 and B2 of cache M1 with vectors read out of successive addresses of vector memory 20. During subsequent test cycles, assuming there are no vector address jumps, the CACHE_OP opcode tells cache controller 36 to increment the bank A and B read addresses every few test cycles so that eventually all of the vectors stored in blocks A1 and B1 are read out to vector alignment circuit 30 of FIG. 1 and used to control test activities. By the time it reaches the last address of blocks A1 and B1 of cache M1, blocks A2 and B2 of M1 are filled with vectors from vector memory 20. At that point, the next CACHE_OP calling for an address increment tells cache controller 36 to begins read addressing banks A2 and B2 of M1.

If none of the previously received CACHE_OP opcodes indicate that blocks A1 and B1 of M1 contain vectors at the start of a loop or a return from a call, then the vectors stored in blocks A1 and B1 of M1 are no longer needed. Thus while it is reading vectors out of blocks A2 and B2 of M1, cache controller 36 begins reading a next set of vectors out of vector memory storage area 32 and writing them into blocks A1 and B1 of M1, over-writing the vectors previously stored therein. After cache controller 36 reaches the last address of blocks A2 and B2 of M1, the next CACHE_OP opcode calling for an address increment tells cache controller 36 to return to the first address of block A1 and B1 of M1. If neither block A2 nor B2 of cache M1 contains a vector at the start of a loop or return, the vectors stored in those blocks are no longer needed and cache controller 36 begins moving a next set of vectors from main vector storage area 32 into blocks A2 and B2 of cache M1. This process continues with cache controller 36 alternately reading from and writing to blocks A1/B1 and A2/B2 of cache memory M1 until it receives either a CACHE_OP opcode indicating the start of a loop or a subroutine call.

For example suppose cache controller 36 is read addressing blocks A1 and B1 of cache M1 when it receives a CACHE_OP opcode indicating a currently addressed cache memory location contains a vector at the start of loop 1. Cache controller 36 immediately responds by storing the current cache memory A and B read addresses as the "loop 1 start" address but continues to step through addresses of blocks A1 and B1 and then blocks A2 and B2 of cache M1 in the normal fashion. However upon moving to the first address of blocks A2 and B2 of cache M1, cache controller 36 begins moving vectors from vector memory 20 into blocks A1 and B1 of cache M2 instead overwriting vectors in banks A1 and B1 of cache M1. Thereafter after having read accessed the last storage locations of blocks A2 and B2 of cache M1, cache controller 36 begins reading vectors from blocks A1 and A2 of cache M2. Cache M2 thus becomes the active main cache while cache M1 becomes the "loop 1" cache to which cache controller 36 may return in response to a subsequently received CACHE_OP opcode indicating that it should jump to the loop 1 start address. All vectors are retained in the loop cache M1 and not over written until such time as the CACHE_OP opcode indicates that the repetitions of loop 1 are at an end.

When cache controller 36 starts loading vectors into cache M2 it stores the main vector memory address of the first block of vectors read out of vector memory 20 as a "loop 1 resume" address. Cache controller 36 thereafter continues to use cache memory M2 as the main cache memory until the CACHE_OP opcode tells it to jump back to the loop 1 start address of banks A1 and B1 of cache M1. At that point, cache controller 36 begins reading vectors out of vector memory 20 starting at the loop 1 resume address and loading them back into cache M2. Thus when during its second pass through the loop 1 sequence of vectors it reaches the last address of cache M1 and moves on to the first address of cache M2, the vectors it needs to resume the loop are available in cache M2.

When at some point instruction processor 26 of FIG. 1 receives a LOOP1_END opcode its sends a CACHE_OP opcode to cache controller 36 indicating that loop 1 is not to be repeated. Cache controller 36 continues to use cache M2 as the currently active main cache but marks bank M1 as a "free cache" that is may subsequently use as the active main cache when at some point cache M2 becomes a loop cache.

When instruction processor 26 of FIG. 1 receives a "CALL" opcode while cache M2 is the current cache, it sends a CACHE_OP opcode to cache controller 36 telling it to mark cache M2 as a "resume", cache, to store the current cache memory address as a "return" address, and to jump to the first address of blocks A1 and B1 of call cache memory C1. While cache controller 36 is reading the first vectors of the subroutine sequence out of cache C1, it begins loading remaining vectors of the subroutine sequence into any one of caches M1-M4 that is "free", not marked as a loop 1 cache, a loop 2 cache, or a return cache. For example if cache M1 is still marked as the loop 1 cache and cache M2 and the return cache, then cache controller 36 begins loading the remaining subroutine vectors into cache M3. When told to increment the cache memory address after reading vectors from the last addresses of cache C1, cache controller 36 jumps to cache M3 and makes that the active cache. When instruction processor 26 of FIG. 1 subsequently receives a RETURN opcode, it sends a CACHE_OP opcode to cache controller 36 telling it to jump back to the return address of the "return" cache M2. Cache controller 36 then uses cache M2 as the main cache.

Four main caches M1-M4 are provided because at any given moment while one of caches M1-M4 will be in use as the active main cache, a second cache may be reserved as the loop 1 cache, a third cache may be reserved as the loop 2 cache, and the fourth main cache may be reserved as the return cache. Thus in the preferred embodiment of the invention cache memory system 28 can execute one subroutine and up to two nested loops. Those skilled in the art will appreciate that the system could be expanded to handle two subroutines instead of one by increasing the number of call caches C1 from one to two, increasing the number of main cache memories M1-M4 by one, and reserving a second subroutine storage area in vector memory 20 for storing the vectors for the second subroutine. Also the CALL and RETURN opcode OPA–OPD inputs to instruction processor 26 would have to indicate which of the two possible subroutines is being called in the same way that LOOP1 and LOOP2 opcodes distinguish which of two loops is being referenced. A third level of loop nesting could be added by adding an additional main cache M1-M4 and by expanding the OPA–OPD opcode set to include an appropriate set of LOOP3 instructions.

The Cache_Op Opcode

FIG. 3 illustrates the 6-bit CACHE_OP opcode instruction processor 26 supplies to cache controller 36 at the start of each test cycle.

The sixteen vectors VAA–VAH and VBA–VBH read out of cache memory banks A and B during each test cycle are associated with sixteen consecutive vector addresses. Cache controller 36 of FIG. 2 alternately increments the current read addresses of cache memory banks A and B so that at any time cache controller 36 may provide the same read address to both banks A and B, or may supply an address to bank A that is one greater than the address it supplies to bank B. If bank A and bank B have the same current read address, the virtual addresses of vectors VAA–VAH precede the virtual addresses of vectors VBA–VBH. When the current read address of bank A is one greater than the address of bank B, then virtual addresses of vectors VBA–VBH precede the virtual addresses of vectors VAA–VAH. Since each storage location in bank A or bank B holds vectors associated with eight virtual addresses, cache controller 36 must increment either the bank A address or the bank B address whenever instruction processor 26 of FIG. 1 increments the virtual address of vector VA by eight. For each test cycle, instruction processor 26 may increment the vector address from 0 to 4 depending on repeats. Instruction processor 26 keeps track of the number of times it increments the current virtual address to determine when cache controller 36 should increment its bank A or bank B cache memory address. The CACHE_OP opcode includes an INCA bit set when cache controller 36 is to increment the bank A address and an INCB bit set when the cache controller is to increment the bank B address.

The CACHE_OP opcode also includes an ACTION field indicating the action cache controller 36 is to carry out during the next cycle. As discussed above, such actions may include marking the current cache as a loop 1, loop 2 or return cache and saving a loop 1 or loop 2 start address, saving a return address, jumping to a call, loop 1 start, loop 2 start or return address, or freeing a loop or return cache.

Cache Controller

Figure 4:
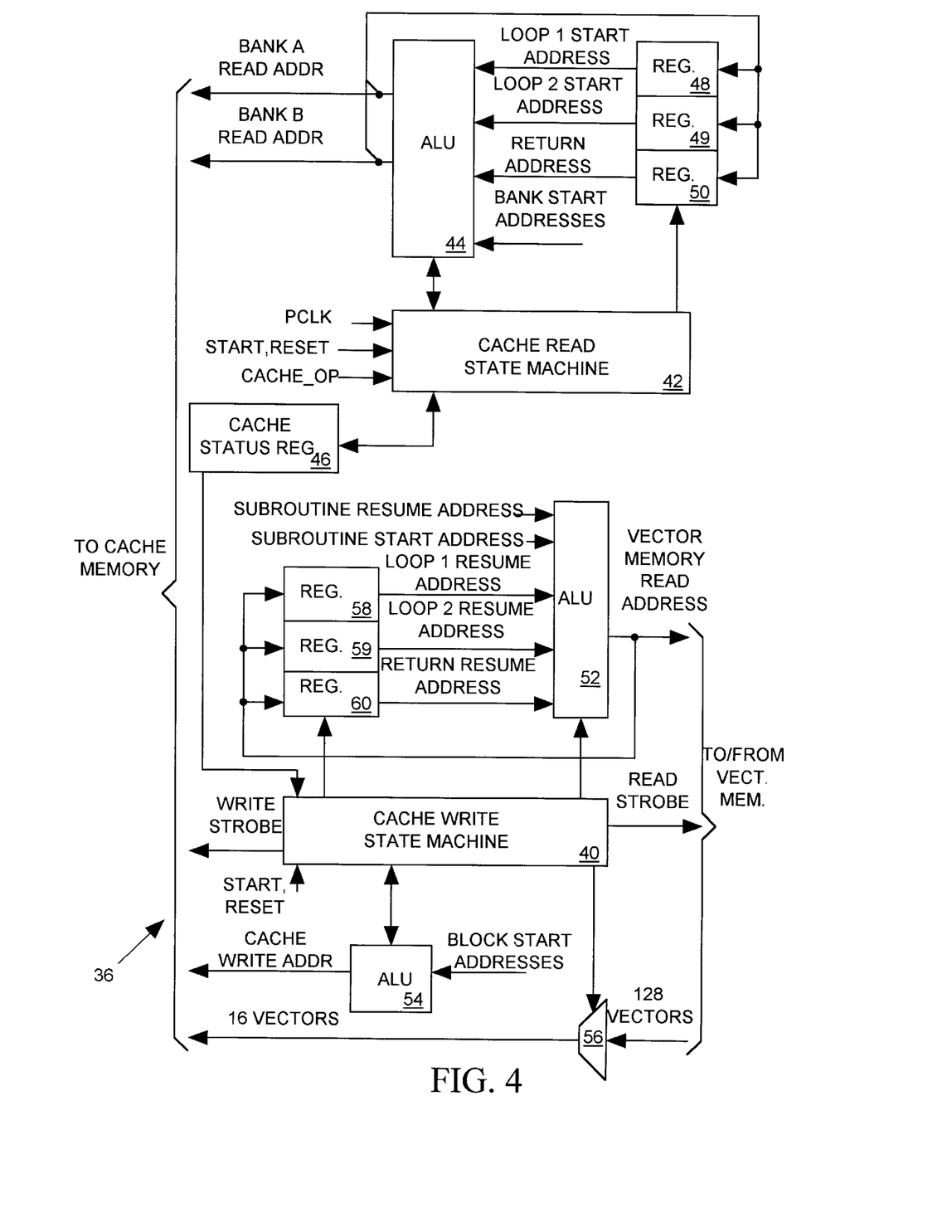
FIG. 4 illustrates the cache controller of FIG. 2 in more detailed block diagram.

FIG. 4 illustrates cache controller 36 of FIG. 2 in more detailed block diagram form. Referring to FIG. 4, cache controller 36 includes a cache write state machine 40 for controlling the operation of reading vectors out of the vector memory and writing them to the cache memory. Cache controller 36 also includes a cache read state machine 42 for read addressing the cache memory.

Cache read state machine 42 receives the CACHE_OP opcode and controls an arithmetic logic unit (ALU) 44 which generates the cache memory bank A and bank B read addresses. Cache read state machine 42 uses a cache status register 46 for saving data indicating the status of caches M1-M4 of FIG. 2. The status data indicates which blocks of cache M1-M4 or C1 are currently active cache read or write blocks. The state data also indicates which caches, if any, are reserved as loop1, loop2 or return caches.

When cache read state machine 42 receives a CACHE_OP opcode with an INCA or INCB bit set, it signals ALU 44 to increment the bank A or bank B read address. When a CACHE_OP opcode indicates a loop 1 or loop 2 start or a subroutine call, state machine 42 signals an appropriate one of a set of registers 48–50 to save the current address output of ALU 44 as the loop 1 or loop 2 start address or the return address. State machine 42 also loads data into cache status register 46 to mark the currently active cache as the loop 1, loop 2 or return cache. State machine 42 consults the data in status register 46 to locate a free cache M1-M4 to be used as the next active cache.

When state machine 42 receives a CACHE_OP opcode indicating that the read address is to return to the start of loop 1 or loop 2, or is to return to the return address, it signals ALU 44 to load the appropriate address from one of registers 48–50 so as to reset the bank A and bank B read addresses to the return address. A CACHE_OP opcode indicating a loop 1 or loop 2 end tells state machine 42 to write data to status register 46 indicating that the cache M1-M4 previously used as the loop 1 or loop 2 cache is now free.

When the bank A or bank B read address reaches the end of a cache boundary, ALU 44 signals state machine 42. State machine 42 responds by checking state register 46 to determine which cache memory blocks to next read access and also writes data into status register 46 to indicate which cache memory blocks are to receive the next set of vectors read out of vector memory 20.

At system startup, the LOAD signal tells cache write state machine 40 to read the first portion of the subroutine vectors out of the vector memory and write them into the call cache C1 of FIG. 2. State machine 40 also writes the first group of main program vectors into blocks A1 and B1 of bank M1. Thereafter it monitors cache status register 46 until state machine 42 marks another pair of cache blocks (initially blocks A2 and B2 of bank M1) as being ready to receive the next set of vectors from vector memory 20. State machine 40 then writes the next set of vectors to those cache memory blocks, and when finished, again consults status register 46 to determine when and where to write a next set of vectors.

An ALU 52 generates the vector memory read address while an ALU 54 generates the cache memory write address. State machine 40 tells ALUs 52 and 54 when to increment their output addresses and also tells them when to load new starting addresses. A multiplexer 56 under control of state machine 40 selects 16 vectors to be written to the current cache memory bank A and B write address from among the 128 vectors read out of the current vector memory read address. ALU 54 signals state machine 40 when it has written vectors to the last address of a block. State machine 40 then consults status register 46 to determine when a cache memory is ready to receive the next set of vectors and then signals ALU 54 to load the starting address of that cache memory block and begins writing vectors to that cache memory block.

When cache read state machine 42 receives a CACHE_OP opcode indicating a loop 1 start, loop 2 start, or subroutine call, it writes data to status register 46 marking the currently read cache block as a loop 1, loop 2 or return block. When cache write state machine 40 finishes writing vectors to a cache memory block and consults status register 46, it determines whether the current cache memory is marked as a loop 1, loop 2 or return block. If so then it saves the next vector memory address as a loop 1, loop 2 or return "resume" address in one of a pair of registers 58 and 59. Later, when state machine 42 receives an opcode telling it to return to the loop 1 or loop 2 start or to return from a call, it writes data into status register 46 telling state machine 40 to load the loop 1, loop 2 or return resume address into ALU 52 before it begins obtaining vectors to be written into the next write cache block. The vectors stored at resume address are the first vectors of loop 1, loop 2 or the main program that are not already stored in the loop 1, loop 2 or return cache and therefore must be obtained from the vector memory and written into the next available cache memory.

When state machine 42 receives a CACHE_OP opcode indicating that it should return from a call, it writes data into status register 46 telling state machine 40 to begin loading the next available cache memory block with vectors starting at a subroutine resume address of subroutine storage area 32 of vector memory 20 (FIG. 2). Since the first portion of the vectors of a called subroutine were previously stored in cache C1, the remaining vectors of the subroutine, starting at the subroutine resume address must be obtained from the vector memory. State machine 40 therefor signals ALU 52 to load the subroutine resume address.

Vector Alignment Circuit and Instruction Processor

Figure 5:
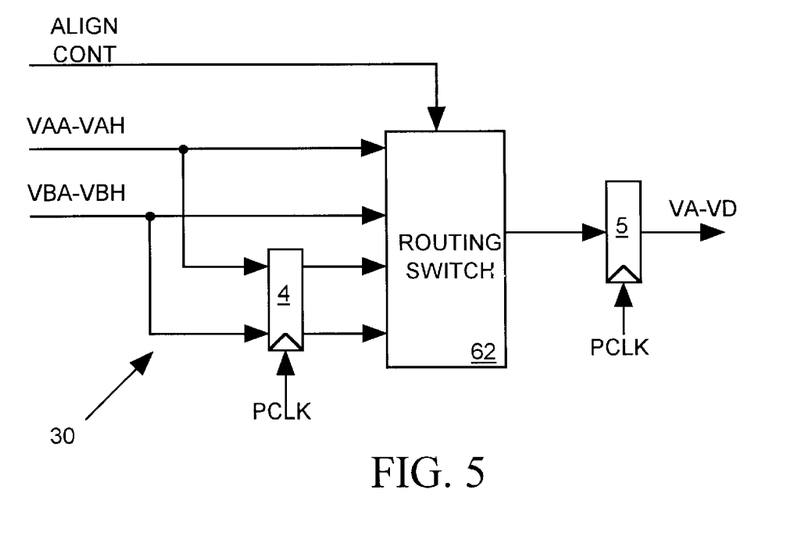
FIG. 5 illustrates the vector alignment circuit of FIG. 1 in more detailed block diagram form.

FIG. 5 illustrates vector alignment circuit 30 of FIG. 1 in more detailed block diagram form. Referring to FIG. 5, vector alignment circuit 30 includes a register 4 clocked by the PCLK signal for delaying the sixteen output vectors VAA–VAH, VBA–VBH of cache memory system 28 of FIG. 1 by one test cycle and applying then as inputs to a routing switch 62. Routing switch 62 also directly receives the sixteen output vectors VAA–VAH, and VBA–VBH of cache memory system 28 of FIG. 1. Routing switch 62, suitably a crosspoint switch or a tree of multiplexers, produces the four vectors VA–VD supplied to formatter 16 of FIG. 1 by selecting them from among its 32 input vectors in response to the alignment control data ALIGN_CONT from instruction processor 26 of FIG. 1. A register 5 clocks the VA–VD vectors onto the input of tester channel CH1.

Figure 6:
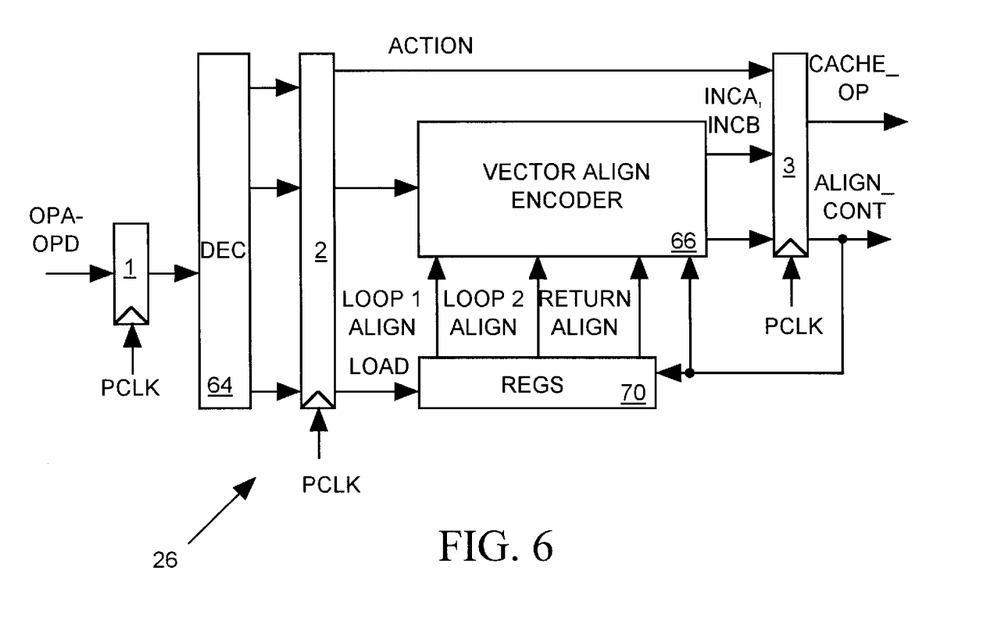
FIG. 6 illustrates the instruction processor of FIG. 1 in more detailed block diagram form.

FIG. 6 illustrates instruction processor 26 of FIG. 1 in more detailed block diagram form. Referring to FIG. 6, a register 1, clocks the OPA–OPD opcodes onto the input of a decoder 64 in response to each pulse of the period clock signal PCLK. Decoder 64 decodes the OPA–OPD opcodes to generate the ACTION field of the CACHE_OP opcode. The ACTION field is clocked through two register stages 2 and 3 onto the input of cache memory system 28 (FIG. 1). In decoding the four opcodes OPA–OPD, decoder 64 also supplies data input to an encoder 66 via register stage 2 indicating how the next four vectors VA–VD are to be obtained. Encoder circuit 66 generates the alignment control data ALIGN_CONT clocked onto the input of routing switch 62 of FIG. 5 via register stage 3. In order to determine which of its input vectors routing switch 62 of FIG. 5 is to select as output vectors VA–VD for a test cycle, encoder 66 must also know which of the 32 vectors at the input to routing switch 62 were selected as the VA–VD vectors for the preceding test cycle. Since this information is indicated by the alignment control output of register 3, that data is fed back to encoder 66. When it is necessary for cache memory system 28 to increment the bank A or bank B read address in order to read out a needed vector, encoder 68 sets the appropriate INCA or INCB bit of the CACHE_OP opcode.

For example assume that the alignment control data input to encoder 66 indicates that vector alignment circuit 30 selected vector VAH as the vector VD for the last segment of a test cycle. Assume also that for the next test cycle opcodes OPA and OPB are repeats and opcodes OP3 and OP4 are increments. The opcode set OPA–OPD supplied to instruction processor 26 is therefore of the form {REPEAT, REPEAT,INC,INC}. In this case, since there is no need to increment either the bank A or bank B address and encoder 66 sets neither the INCA or INCB bits. Cache memory 28 therefore reads out the same set of sixteen vectors VAA–VAH, VBA–VBH that it read out during the preceding test cycle. However encoder 66 now sets its ALIGN_CONT data output to tell alignment circuit 30 to select vector VAH as vectors VA and VB and to select vectors VBA and VBB as vectors VC and VD for the next test cycle.

Suppose now that next opcode set OPA–OPD supplied to instruction processor 26 is of the form {INC,INC,INC, INC}. In this case encoder 66 sets the INCA bit of the CACHE_OP opcode to increment the bank A address because the current vector output of cache memory bank A is no longer needed. Bank B of cache memory 28 now reads out the same set of eight vectors VBA–VBH that it read out during the preceding test cycle but bank A reads out a new set of eight vectors VAA–VHA having vector addresses immediately following the vector addresses of vector VBA-VBH. Encoder 66 now sets its ALIGN_CONT data output to tell alignment circuit 30 to select vectors VBC–VBF as vectors VA–VD.

Suppose the next set of opcodes OPA–OPD is of the form {INC, LOOP1_START, INC, REPEAT}. Encoder 66 treats the LOOP1_START in generally the same manner it treats an INC command so that the ALIGN_CONT data it produces tells alignment circuit 30 to select input vectors VBG, VBH, VAA, and VAA respectively as output vectors VA–VD. However since the LOOP1_START command indicates that the vector read out of cache memory in response to that opcode is the first vector of a sequence of vectors (loop 1) to be repeated, the LOOPI START opcode tells decoder 64 to send a CACHE_OP opcode to cache memory system 28 telling it to save its current cache as the loop 1 cache and to remember the address in that cache memory as the loop 1 start address—the cache memory address containing of the first vector of loop 1. The LOOP1_START opcode also tells decoder 64 (FIG. 6) to signal one of a set of three registers 70 to store the alignment control data output of register 3 as the loop 1 start address. This alignment data indicates which cache memory vectors were selected as VA–VD in the test cycle immediately prior to the start of loop 1. Thus when a later received one of the OPA–OPD codes subsequently indicates a loop 1 return, encoder 66 is able to determine how to set the alignment control data for the next test cycle based on a combination of the output of the appropriate register 70, the alignment control data output of register 3 for the preceding cycle, and the information provided by decoder 64.

Let us suppose now that the next set of opcodes OPA–OPD are of the form {INC,INC,LOOP1_RETURN, INC}. Since one of the opcodes is the LOOP1_RETURN opcode, decoder 64 set the CACHE_OP opcode to tell cache memory system 28 to jump to the previously saved starting address of the loop 1 start cache. Thus the 16 vectors VAA–VAH and VBA–VBH that cache memory 28 reads out includes the first vector of loop 1. The LOOP1_ALIGN data contained in register 70 tells encoder 66 which one of those 16 vectors (VBH) is the starting vector of the loop. The ALIGN_CONT data encoder 66 produces tells alignment circuit 30 to select VBH and VAA as vectors VC and VD since the opcodes OPC and OPD were LOOP1_RETURN and INC opcodes.

Since the LOOP1_RETURN opcode resulted in a cache memory address jump to the start of the loop 1 vector, the output of cache memory 28 will not include the two vectors referenced by the OPA and OPB opcodes (INC,INC) that preceded the address jump. But note that vector alignment circuit 30 of FIG. 5 sends the incoming flow of vectors VAA–VAH and VBA–VBH from cache memory system 28 to routing switch 62 via two paths, an "increment/repeat" path and a "jump" path. The increment/repeat path delivers the vectors VAA–VAH and VBA–VBH directly to routing switch 62 while the jump path delivers those vectors to routing switch 62 via register 4 with a one test cycle delay. The input to routing switch 62 therefore includes the cache memory output vectors for the two most recent test cycles. While the output of cache memory 28 includes only vectors at the jump address and does not include the two vectors referenced by the OPA and OPB opcodes (INC,INC) that preceded the address jump, those two vectors are available as vectors VBG and VBH stored in register 4. Thus encoder 66 (FIG. 6) sets the ALIGN_CONT data to tell routing switch to select vectors VBG and VBH of the jump path as output vectors VA and VB and to select vectors VBH and VAA of the increment/repeat path as output vectors VC and VD.

When the OPA–OPD opcodes include only increment and/or repeats, the CACHE_OP pointer input to the cache memory system can only be incremented by up to 4 over the CACHE_OP pointer for the previous test cycle. When cache memory system 28 responds to the incremented pointer, if necessary by incrementing the A or B bank address, it provides 16 output vectors VAA_VAH and VBA–VBH at successive addresses. Those output vectors are guaranteed to include the four vectors VA–VD to be selected for the next test cycle. Thus routing switch 62 of vector alignment circuit 30 (FIG. 5) will be able to select the appropriate output vectors VA–VD only from the INCREMENT/REPEAT path.

However when one of the opcodes OPA–OPD includes an instruction such as a LOOP1_REPEAT, LOOP2_REPEAT, CALL, or RETURN that causes an address jump in the vector flow arriving at vector alignment circuit 30, the CACHE_OP opcode input to cache memory system 28 will tell it to immediately jump to that cache memory address. Thus the output vectors VAA–VAH and VBA–VBH of cache memory system 28 will include only vectors read out of the jump address. They will not include any vectors that may be needed for test cycle segments preceding the jump. But such "prejump" vectors will be available to routing switch 62 via register 4.

Tester Channels

Referring again to FIG. 1 each channel CH1-CHJ includes a pin electronic circuit 14 for accessing a pin of DUT 12. During a test, when DUT 12 produces an output signal at the pin, pin electronics circuit 14 monitors the DUT output signal and produces a pair of signals CH and CL indicating whether the signal is above a high logic level or below a low logic level, respectively. When DUT 12 is to receive an input signal at the pin, pin electronics circuit 14 supplies that DUT input signal in response to a set of three input signals DH, DL and Z. Each pulse of the DH or DL signal tells pin electronics circuit 14 to drive the DUT pin to a high or low logic level, respectively. A pulse of the Z signal tells pin electronics circuit 14 to tristate the pin.

Each tester channel also includes a formatter circuit 16 and a timing circuit 18. During each cycle, timing circuit 18 supplies formatter 16 with a set of timing signals TS that are distributed in phase so as to divide the test cycle into multiple time slots. At the start of each test cycle, formatter 16 receives the set of four 4-bit vectors (VA–VD) produced by vector alignment circuit 30. Vector VA tells formatter 16 to select one of timing signals TS having a pulse occurring during the first test cycle segment and to initiate an activity during the first test cycle segment in response to that timing signal pulse. Each vector VB–VD has a similar function with respect to the second, third and fourth test cycle segments, respectively. Formatter 16 can take any of several actions during any segment including pulsing any one of its output DH, DL or Z signals to change the state of a DUT input signal, or sampling the CH and CL signals to determine the state of a DUT output signal. When the state of the DUT output signal does not match an expected state indicated by an input vector, formatter 16 transmits a FAIL signal to host computer 15 to indicate DUT 12 has failed the test.

Thus has been shown and described an integrated circuit tester 10 employing a set of vector pattern generators PG1-PGJ in accordance with the invention to supply a set of four vectors VA–VD to each tester channel CH1-CHJ at the start of each cycle of the test to control channel activities during four segments of the cycle. Since the vector pattern generators PG1-PGJ need to read out vector data once per test cycle during a time in which the channel CH1-CHJ carries out four successive activities, the test frequency is four times higher that the vector pattern generator operating frequency. This enables tester 10 to test a DUT 12 at a higher frequency than it can read access the vector cache memory and at a much higher frequency than it needs to read access vector memory 20. Those skilled in the art will appreciate that tester 10 could be modified so that it divides each test cycle into a larger number of segments by increasing the width of the cache and vector memories and suitably modifying the vector pattern generator and channel circuits to produce and respond to a larger number of vectors at the start of each test cycle.

Those skilled in the art will also appreciate that the instruction pattern generator 11 of FIG. 1 could be replaced with a set of J instruction pattern generators, one for each channel CH1-CHJ. Since each vector pattern generator PG1-PGJ would then receive a different sequence of OPA–OPD opcodes, each vector pattern generator PG1-PGJ could independently make use of loops and calls to read out repetitive vector sequences.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An algorithmic pattern generator for periodically generating an output set of N vectors, where each vector is a pattern data value and where N is an integer greater than one, the pattern generator comprising:

a first memory (35) having a plurality of storage locations each for storing M vectors, where M is an integer greater than N, each storage location having a unique address and reading out its stored M vectors stored when addressed by an input address supplied to said first memory;

processing means (11,26) for periodically generating an opcode and a vector alignment code, wherein the opcode references an address;

memory controller means (36) for receiving and responding to each opcode generated by said processing means by generating the address referenced by the opcode and supplying it as the input address to said first memory, such that said first memory concurrently reads out a sequence of vector sets, with M vectors included in each vector set; and vector alignment means (30) for receiving said sequence of vector sets and for receiving and responding to each alignment code produced by said processing means by selecting vectors from among said sequence of vector sets and supplying them as vectors of an output set of N vectors.

2. The algorithmic pattern generator in accordance with claim 1 further comprising a second memory (20) having a plurality of second storage locations each storing a set of L vectors, where L is an integer greater than M, wherein said memory controller means also reads sets of L vectors out of said second memory and writes them as sets of M vectors into said first storage locations.

3. The algorithmic pattern generator in accordance with claim 2 wherein one of said opcodes references an address to be generated by said memory controller by telling said memory controller to increment an address last generated by said memory controller, wherein in response to at least one of said opcodes said memory controller stores its currently generated first memory input address as a loop start address, and wherein in response to at least one of said opcodes said memory controller supplies the stored loop start address as said first memory input address.

4. The algorithmic pattern generator in accordance with claim 3.

wherein in response to at least one of said opcodes said memory controller stores its currently generated first memory input address as a return address and then sets the first memory input address to new value, and wherein in response to at least one of said opcodes said memory controller supplies the stored return address as said first memory input address.

5. The algorithmic pattern generator in accordance with claim 2 wherein at least one of said alignment codes tells said vector alignment means to select one vector of the received sequence of vector sets and to supply it as more than one of said vectors of said output set of N vectors, and wherein at least one of said alignment codes tells said vector alignment means to select vectors from more than one received vector set and to supply them as the vectors of a single output set of N vectors.

6. The algorithmic pattern generator in accordance with claim 1 wherein one of said opcodes references an address to be generated by said memory controller by telling said memory controller to increment an address last generated by said memory controller.

7. The algorithmic pattern generator in accordance with claim 1 wherein in response to at least one of said opcodes said memory controller stores its currently generated first memory input address as a loop start address, and wherein in response to at least one of said opcodes said memory controller supplies the stored loop start address as said first memory input address.

8. The algorithmic pattern generator in accordance with claim 1 wherein in response to at least one of said opcodes said memory controller stores its currently generated first memory input address as a return address and then sets the first memory input address to new value, and wherein in response to at least one of said opcodes said memory controller supplies the stored return address as said first memory input address.

9. The algorithmic pattern generator in accordance with claim 1 wherein at least one of said alignment codes tells said vector alignment means to select one vector of the received sequence of vector sets and to supply it as more than one of said vectors of said output set of N vectors.

10. The algorithmic pattern generator in accordance with claim 1 wherein at least one of said alignment codes tells said vector alignment means to select vectors from more than one received vector set and to supply them as the vectors of a single output set of N vectors.

11. An integrated circuit (IC) tester for performing a test on IC having a plurality of pins, wherein said test is organized into a succession of test cycles, wherein each test cycle is subdivided into N segments, wherein N is an integer greater than one, wherein the IC tester carries out a test activity at each IC pin during each segment of each test cycle, wherein the IC tester comprises:

a plurality of tester channels (CH1-CHJ), each for receiving a set of N vectors prior to the start of each test cycle, each vector indicating a test activity to be carried out during a separate segment of said test cycle, and for carrying out the test activities indicated by said set of N vectors;

a first memory (35) having a plurality of storage locations each for storing M vectors, where M is an integer greater than N, each storage location having a unique address and reading out its stored M vectors stored when addressed by an input address supplied to said first memory;

processing means (26) for periodically generating an opcode (CACHE_OP) and a vector alignment code (ALIGN_CONT), wherein the opcode references an address;

memory controller means (36) for receiving and responding to each opcode generated by said processing means by generating the address referenced by the opcode and supplying it as the input address to said first memory, such that said first memory reads out a sequence of vector sets, with M vectors being included in each vector set; and vector alignment means (30) for receiving said sequence of vector sets and for receiving and responding to each alignment code produced by said processing means by selecting vectors from among said sequence of vector sets and supplying them as vectors of an output set of N vectors to said testing means.

12. The IC tester accordance with claim 11 wherein each tester channel further comprises a second memory (20) having a plurality of second storage locations each storing a set of L vectors, where L is an integer greater than M, and wherein said memory controller means also reads sets of L vectors out of said second memory and writes them as sets of M vectors into said first memory.

13. The IC tester in accordance with claim 12 wherein one of said opcodes (INC) references an address to be generated by said memory controller by telling said memory controller to increment an address last generated by said memory controller, wherein in response to at least one of said opcodes (LOOP1_START) said memory controller stores its currently generated first memory input address as a loop start address, and wherein in response to at least one of said opcodes (LOOP1_BACK) said memory controller supplies the stored loop start address as said first memory input address.

14. The IC tester in accordance with claim 13 wherein in response to at least one of said opcodes (CALL) said memory controller stores its currently generated first memory input address as a return address and then sets the first memory input address to new value, and wherein in response to at least one of said opcodes (RETURN) said memory controller supplies the stored return address as said first memory input address.

15. The IC tester in accordance with claim 12 wherein at least one of said alignment codes tells said vector alignment means to select one vector of the received sequence of vector sets and to supply it as more than one of said vectors of said output set of N vectors, and wherein at least one of said alignment codes tells said vector alignment means to select vectors from more than one received vector set and to supply them to said testing means as the vectors of a single output set of N vectors.

16. The IC tester in accordance with claim 11 wherein one of said opcodes (INC) references an address to be generated by said memory controller by telling said memory controller to increment an address last generated by said memory controller.

17. The IC tester in accordance with claim 11 wherein in response to at least one of said opcodes (LOOP1_START) said memory controller stores its currently generated first memory input address as a loop start address, and wherein in response to at least one of said opcodes (LOOP1_BACK) said memory controller supplies the stored loop start address as said first memory input address.

18. The IC tester in accordance with claim 11 wherein in response to at least one of said opcodes (CALL) said memory controller stores its currently generated first memory input address as a return address and then sets the first memory input address to new value, and wherein in response to at least one of said opcodes (RETURN) said memory controller supplies the stored return address as said first memory input address.

19. The IC tester in accordance with claim 11 wherein at least one of said alignment codes tells said vector alignment means to select one vector of the received sequence of vector sets and to supply it as more than one of said vectors of said output set of N vectors.

20. The IC tester in accordance with claim 11 wherein at least one of said alignment codes tells said vector alignment means to select vectors from more than one received vector set and to supply them as the vectors of a single output set of N vectors.

\* \* \* \* \*